United States Patent
Timmerman et al.

(10) Patent No.: US 9,693,481 B2
(45) Date of Patent: Jun. 27, 2017

(54) THERMALLY CONDUCTIVE DIELECTRIC INTERFACE

(71) Applicant: HENKEL IP & HOLDING GMBH, Duesseldorf (DE)

(72) Inventors: John Timmerman, Minneapolis, MN (US); Jeremy J. Schmitz, Minnetrista, MN (US); Jeremy L Hammond, Stillwater, MN (US)

(73) Assignee: HENKEL IP & HOLDING GMBH, Duesseldorf (DE)

( * ) Notice: Subject to any disclaimer, the term of this patent is extended or adjusted under 35 U.S.C. 154(b) by 359 days.

(21) Appl. No.: 14/310,231

(22) Filed: Jun. 20, 2014

(65) Prior Publication Data

US 2014/0374071 A1    Dec. 25, 2014

Related U.S. Application Data

(60) Provisional application No. 61/839,116, filed on Jun. 25, 2013.

(51) Int. Cl.
*H05K 7/20* (2006.01)
*H01L 23/00* (2006.01)
(Continued)

(52) U.S. Cl.
CPC ....... *H05K 7/2039* (2013.01); *H01L 23/3735* (2013.01); *H01L 23/3737* (2013.01); *H01L 23/42* (2013.01); *H01L 24/29* (2013.01); *H01L 2224/293* (2013.01); *H01L 2224/2908* (2013.01); *H01L 2224/2929* (2013.01);
(Continued)

(58) Field of Classification Search
CPC .............. H05K 7/2039; H01L 23/3735; H01L 23/3737; H01L 23/42; H01L 24/29; H01L 24/30; H01L 24/32; H01L 24/33; H01L 2224/2908; H01L 2224/29082; H01L 2224/29083; H01L 2224/29084;
(Continued)

(56) References Cited

U.S. PATENT DOCUMENTS 6,621,170 B2    9/2003    Yamamoto et al.
6,852,573 B2    2/2005    Ebihara et al.
(Continued)

FOREIGN PATENT DOCUMENTS

CN    1552078 A    12/2004
EP    1389801       2/2004
(Continued)

OTHER PUBLICATIONS

Translation of Official Action in corresponding Korean application serial No. 10-2014-76938 dated May 28, 2015.
(Continued)

*Primary Examiner* — Len Tran
*Assistant Examiner* — Hans Weiland
(74) *Attorney, Agent, or Firm* — James J. Cummings

(57) ABSTRACT

A thermally conductive dielectric interface includes a relatively hard polymer base, and a polymer upcoat disposed at first and second sides of the base. The upcoat has an intermediate condition that is relatively soft and facilitates thermal joints with respective components of an electronic assembly. Curing the upcoat layer to a finished condition solidifies such thermal joints.

14 Claims, 4 Drawing Sheets

(51) Int. Cl.
*H01L 23/373* (2006.01)
*H01L 23/42* (2006.01)

(52) U.S. Cl.
CPC ............... *H01L 2224/29386* (2013.01); *H01L 2224/32245* (2013.01); *Y10T 29/4935* (2015.01)

(58) Field of Classification Search
CPC ....... H01L 2224/2929; H01L 2224/293; H01L 2224/29386
USPC .......................................................... 165/185
See application file for complete search history.

(56) References Cited

U.S. PATENT DOCUMENTS

| | | |
|---|---|---|
| 6,956,739 B2 | 10/2005 | Bunyan |
| 7,229,683 B2 | 6/2007 | Fischer et al. |
| 8,119,191 B2 | 2/2012 | Bunyan et al. |
| 2002/0012762 A1 | 1/2002 | Bunyan |
| 2003/0158294 A1* | 8/2003 | Chaudhuri ............... C08K 3/08 523/205 |
| 2006/0014888 A1* | 1/2006 | Miller ...................... C08K 7/02 524/544 |
| 2006/0228542 A1* | 10/2006 | Czubarow ........... H01L 23/3737 428/323 |
| 2010/0104938 A1 | 4/2010 | Hermann |
| 2010/0297453 A1 | 11/2010 | Maenaka et al. |
| 2012/0087094 A1 | 4/2012 | Hill et al. |
| 2013/0189514 A1* | 7/2013 | Nishiyama ............ H01L 23/145 428/323 |

FOREIGN PATENT DOCUMENTS

| | | | |
|---|---|---|---|
| EP | 1993134 | | 11/2008 |
| EP | 2626205 | | 8/2013 |
| EP | 2692526 | | 2/2014 |
| JP | 2002134531 | | 5/2002 |
| JP | 2004134604 | | 4/2004 |
| JP | 2004134604 A | * | 4/2004 |
| WO | 2012046814 | | 4/2012 |

OTHER PUBLICATIONS

Search Report and Written Opinion issued in related European Patent Application serial No. 14173731.2.
Translation of Office Action in related Korean patent application serial No. 10-2014-76938 dated May 28, 2015.

* cited by examiner

THERMALLY CONDUCTIVE DIELECTRIC INTERFACE

CROSS-REFERENCE TO RELATED APPLICATIONS

This application claims priority to U.S. Provisional Patent Application Ser. No. 61/839,116, filed on Jun. 25, 2013 and entitled "Thermally Conductive Dielectric Interface," the content of which being incorporated herein in its entirety.

FIELD OF THE INVENTION

The present invention relates to thermal management materials generally, and more particularly to a thermally conductive dielectric interface for thermal energy transmission between heat transfer surfaces of components in an electronic apparatus. The interface of the present invention preferably bonds with the heat transfer surfaces to form a secure joint between the respective components.

BACKGROUND OF THE INVENTION

Thermally transmissive materials are widely employed as interfaces between, for example, a heat-generating electronic component and a heat sink for permitting transfer of excess thermal energy from the electronic component to a thermally coupled heat sink. Numerous designs and materials for such thermal interfaces have been implemented, with the highest performance being achieved when gaps between the thermal interface and the respective heat transfer surfaces of the electronic component and the heat sink are substantially avoided. In many cases, therefore, the thermal interface material is relatively soft, at least at operating temperatures, so as to be "conformable" to the somewhat uneven heat transfer surfaces of the respective components.

It is another aspect of many thermally conductive interfaces to be dielectric, so as to avoid short-circuiting of the electronic components to which the thermal interface is secured. An example conventional interface is described in U.S. Pat. No. 4,810,563, the content of which being incorporated herein by reference.

Thermal interface structures can often form a joint securing together separate components of an electronic assembly. The ideal joint, therefore, is highly thermally transmissive, exhibits a strong bonding characteristic to the heat transfer surfaces of the components, and, in some cases, is highly electrically insulative (dielectric). Such interfaces should also be easily incorporated into electronic device assembly procedures, and be relatively inexpensive. Currently available interfaces do not adequately address each of the desired characteristics described above. There is accordingly a need for a thermally conductive, dielectric interface that proficiently transports thermal energy between heat transfer surfaces of separate components in an electronic assembly, and which interface is capable of providing a strong bond between such components to act as a permanent joint therebetween.

SUMMARY OF THE INVENTION

By means of the present invention, electronic components may be securely bonded to associated heat dissipation members through a thermally conductive, dielectric interface. The present interface provides a conformable and adherent outer layer that aids in obtaining a thermally efficient connection to the electronic component, as well as to the heat dissipation member. Subsequent to installation, the interface may undergo an additional curing procedure to permanently affix the assembly while retaining the desired thermal conductivity and electrical resistivity properties of the interface.

In one embodiment, a thermally conductive dielectric interface includes a base having first and second sides substantially parallel to a base plane, and exhibiting a compressive modulus of at least $10^5$ Pa, wherein the base is formed from a first silicone polymer preparation. The interface further includes an upcoat disposed at the first and second sides of the base, with the upcoat exhibiting a compressive modulus of less than $10^4$ Pa. The upcoat includes a second silicone polymer preparation, wherein a thickness of the interface is defined along an axis that is perpendicular to the base plane and extends through the upcoat and the base. The interface exhibits a voltage breakdown value of at least 3 kV and a thermal conductivity of at least 0.5 W/m*K through the thickness.

A method for mounting a heat sink to a heat-generating electronic component includes securing the thermally conductive dielectric interface between the heat sink and the heat-generating electronic component.

In another embodiment, a thermally conductive dielectric interface of the present invention includes a core having first and second opposed surfaces substantially parallel to a core plane, and defining respective first and second sides of the interface. The interface further includes a base layer with an inner surface applied to each of the first and second surfaces of the core, with the base layer having thermally conductive particles dispersed in a first polymer preparation. The base layer exhibits a compressive modulus of at least $10^5$ Pa. An upcoat layer is applied to an outer surface of the base layer at both the first and second sides of the interface, with the upcoat layer including thermally conductive particles dispersed in a second polymer preparation. The upcoat layer exhibits a compressive modulus of less than $10^4$ Pa. A thickness of the thermally conductive interface is defined along an axis perpendicular to the core plane and extends through the upcoat layer, the base layer, and the core. The interface exhibits a thermal conductivity of at least 0.5 W/m*K, and an electrical resistivity of at least $10^{10}$ Ω*m through the thickness.

DETAILED DESCRIPTION OF THE PREFERRED EMBODIMENTS

Figure 1:
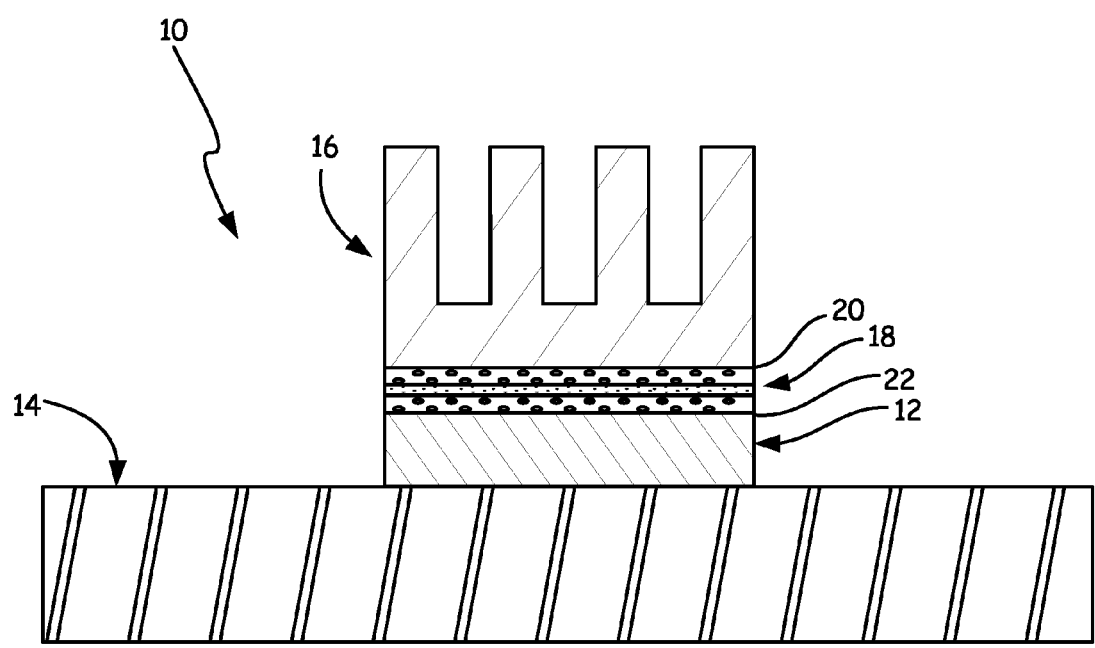
FIG. 1 is a cross-sectional schematic view of an electronic device assembly of the present invention.

The objects, features, and advances represented by the present invention will now be presented in terms of detailed embodiments. Other embodiments and aspects of the invention are recognized as being within the grasp of those having ordinary skill in the art.

Unless otherwise apparent or stated, directional references, such as "upper", "lower", "front", "rear", "vertical", "horizontal", "top", "bottom" and the like are intended to be relative to the orientation of a particular embodiment of the invention as shown in the figures. In addition, a given reference numeral in the drawings indicates the same or similar structure when it appears in different figures, and like reference numerals identify similar structural elements and/or features of the subject invention.

With reference now to the drawing figures, an electronic device assembly 10 includes a heat-generating electronic component 12 supported on a substrate 14, which may typically be a printed circuit board (PCB). Electronic component 12 may be any of a variety of heat-generating devices commonly employed in electronics, such as a microprocessor, transistor, integrated microchip, or other power semiconductor device, etc. Electronic component 12 may be secured to substrate 14 through known means, such as soldering, pins, or other connections. The operation of electronic component 12 generates thermal energy, which is desirably dissipated away from electronic component 12 for optimal performance. To aid in dissipating excess thermal energy from electronic component 12, electronic device assembly 10 includes a thermal dissipation member or heat sink 16. In an example embodiment, thermal dissipation member 16 may be provided as a finned heat sink or other heat spreading structure as is commonly employed in the art.

A thermally conductive dielectric interface 18 of the invention may be interposed between respective heat transfer surfaces 20, 22 of thermal dissipation member 16 and electronic component 12 to efficiently transport thermal energy therebetween. Interface 18 may preferably conform to heat transfer surfaces 20, 22 to minimize air gaps between interface 18 and heat transfer surfaces 20, 22, which air gaps would otherwise present an impedance to thermal energy transmission. Interface 18 preferably also provides a joint that both physically and thermally couples thermal dissipation member 16 to electronic component 12. It is to be understood, however, that interface 18 may not directly connect thermal dissipation member 16 to electronic component 12, and may instead merely provide a thermally conductive joint along a thermal pathway between the heat-generating electronic component 12 and thermal dissipation member 16.

Figure 2:
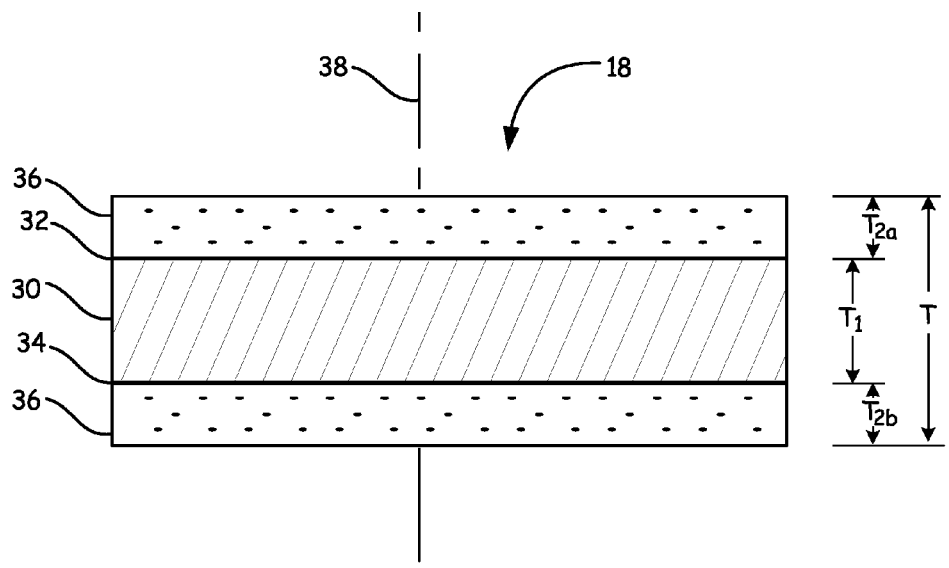
FIG. 2 is an isolation cross-sectional view of a thermally conductive dielectric interface of the present invention.

An isolation cross-sectional view of thermally conductive dielectric interface 18 is illustrated in FIG. 2, including a base 30 having first and second sides 32, 34, and an upcoat 36 disposed at first and second sides 32, 34 of base 30. A thickness "T" is defined along thickness axis 38, which may be substantially perpendicular to first and second sides 32, 34 of base 30. As illustrated in FIG. 2, interface thickness "T" extends through upcoat 36 and base 30. The thickness "T" of interface 18 is intended to represent the dimension between respective heat transfer surfaces 20, 22 of thermal dissipation member 16 and electronic component 12. In some embodiments, thickness "T" is between 100-600 micrometers (μm), wherein base 30 may have an example thickness dimension "$t_1$" of between 50-350 μm, and upcoat 36 may have a total thickness dimension ("$t_{2A}$"+"$t_{2B}$") of between 50-300 μm. To provide the benefits described herein, each upcoat layer thickness dimension "$t_{2A}$" and "$t_{2B}$" is preferably at least 25 μm, and more preferably between 50-150 μm.

A combination of materials, material thicknesses, and material conditions provide the desired set of characteristics of interface 18 of the present invention. Among the desired properties of interface 18 are the conformability of upcoat 36, the adhesion capabilities of upcoat 36, a relatively low compressive modulus upcoat 36, a relatively high compressive modulus of base 30, a high dielectric voltage breakdown strength (also known as voltage breakdown) across thickness "T", and a high thermal conductivity across thickness "T". As an efficient thermal pathway between electronic component 12 and thermal dissipation member 16, interface 18 preferably exhibits a thermal conductivity of at least 0.5 W/m*K through thickness "T", and may, in some embodiments, be between 0.5-3 W/m*K. Moreover, interface 18 is dielectric, and exhibits a voltage breakdown of at least 3 kV.

To accomplish the properties described above, interface 18 may be installed into assembly 10 in an intermediate condition with a relatively "hard" base 30 and a relatively "soft" upcoat 36, with one or more of base 30 and upcoat 36 being suitably thermally conductive and electrically insulative. In this intermediate condition, base 30 exhibits a compressive modulus of at least $10^5$ Pa (100,000 Pa), and upcoat 36 exhibits a compressive modulus of less than $10^4$ Pa (10,000 Pa). For the purposes hereof, the term "compressive modulus" is intended to mean a modulus of elasticity (Young's Modulus), and is the ratio of stress to strain, with units of pressure. In the final finished condition of electronic device assembly 10, upcoat 36 may have a compressive modulus exceeding $10^4$ Pa.

One aspect of the present invention is to obtain a thermally conductive, dielectric interface that exhibits a desired voltage breakdown value, as tested by ASTM D149. The present arrangement achieves the desired voltage breakdown with the relatively high compressive modulus base 30 that is sufficiently rigid to prevent interface 18 from excessively compressing along thickness axis 38 when mounted in electronic device assembly 10. Many conventional conformable thermal interfaces excessively compress along their respective thickness axis, such that the gap between components, such as between an electrical component and a thermal dissipation member, can become small enough to cause voltage breakdown. Moreover, if a heat transfer surface of one of the components in the electronic device assembly has an irregular or burred surface, penetration through an excessively "soft" material can lead to an electrical short or premature voltage breakdown of the thermal interface.

A variety of materials are contemplated as being useful in the production of interface 18, with the overall goal being to obtain a core 30 with a compressive modulus of at least $10^5$ Pa, an upcoat with a compressive modulus, in an intermediate condition, of less than $10^4$ Pa, and with the interface exhibiting a voltage breakdown of at least 3 kV, and a thermal conductivity of at least 0.5 W/m*K through thickness "T". In some embodiments, interface 18 may exhibit an electrical resistance of at least $10^{10}$ Ω*m through thickness "T". In one embodiment, base 30 includes a vinyl silicone polymer matrix within which is dispersed thermally conductive particulate filler, such as alumina. Upcoat may include a vinyl and hydride-functional silicone polymer matrix within which is dispersed a thermally conductive particulate filler, such as alumina.

Both of base 30 and upcoat 36 may preferably be formed of a thermoplastic or thermosetting polymer matrix loaded with thermally conductive particulate material. Example thermoplastic and thermosetting resins useful in the polymeric matrix of base 30 and upcoat 36 include silicone, acrylic, urethane, epoxy, polysulfide, polyisobutylene, and polyvinyl or polyolefin based polymers. The desired compressive moduli of base 30 and upcoat 36 may be achieved through one or more of polymer matrix material selection, cross-linking agent selection, cross-linking controls, cure extent, and the like.

Thermally conductive particulate filler is well known in the art for enhancing the thermal conductivity of a polymer matrix. Example thermally conductive fillers useful in the polymer matrices of the present invention include metals or ceramics, and specifically include, for example, alumina, aluminum nitride, aluminum hydroxide, aluminum oxide, boron nitride, zinc nitride, and silicon carbide. The thermally conductive particulate filler may be dispersed within the polymer matrices at a loading concentration of between about 5-90% by volume, to achieve a desired minimum thermal conductivity through thickness "T" of 0.5 W/m*K. In some embodiments, both of base 30 and upcoat 36 exhibit thermal conductivities of at least 0.5 W/m*K, though it is contemplated that, in other embodiments, only one of base 30 and upcoat 36 exhibit a thermal conductivity of at least 0.5 W/m*K, but nevertheless resulting in an interface 18 exhibiting a thermal conductivity of at least 0.5 W/m*K through thickness "T".

Figure 3:
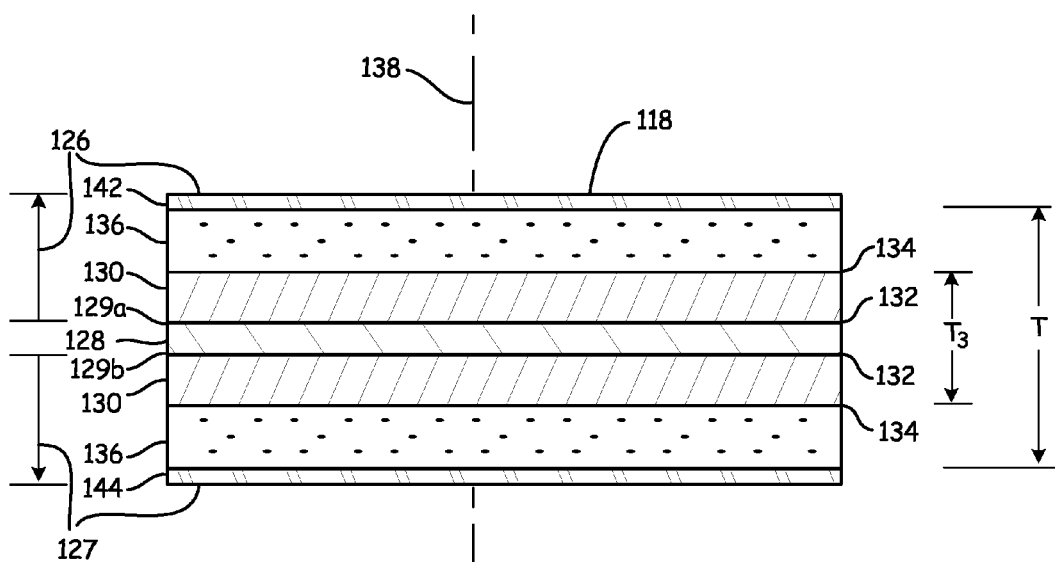
FIG. 3 is an isolation cross-sectional view of a thermally conductive dielectric interface of the present invention.

Another embodiment of the present invention is illustrated in FIG. 3, wherein thermally conductive dielectric interface 118 includes a core 128 having first and second opposed surfaces 129A, 129B defining respective first and second sides 126, 127 of interface 118. A base layer 130 includes an inner surface 132 that is applied to each of first and second surfaces 129A, 129B of core 128. In this embodiment, core 128 acts as a substrate upon which base layer 130 may be applied. In one embodiment, core 128 may be a flexible fiberglass film. Core 128 may not, in some embodiments, appreciably affect the performance properties of interface 118, and may instead primarily serve as a substrate upon which to build the laminate structure of interface 118. Accordingly, core 128 preferably does not significantly inhibit thermal transmission through thickness "T" of interface 118, nor does core 128 significantly detrimentally affect the electrical resistance and voltage breakdown characteristics of interface 118. Core 128 may therefore be selected from a variety of materials and configurations as deemed necessary per application. In some embodiments, core 128 may itself exhibit a thermal conductivity of at least 0.5 W/m*K, though it is to be understood that such thermal conductivity characteristic is not required of core 128. In some embodiments, core 128 may include thermally conductive particulate material dispersed therein to enhance the thermal conductivity of core 128.

Base layer 130 of interface 118 may be analogous to base 30 of interface 18, but with core 128 disposed at least partially within the base. Accordingly, base layer 130 may be, in effect, a base 30 applied to first and second surfaces 129A, 129B of core 128. Base layer 130 may preferably be a polymer matrix that exhibits a compressive modulus of at least $10^5$ Pa, and may include thermally conductive particles dispersed therein to enhance its thermal conductivity properties. The composition of base layer 130 may, in some embodiments, be analogous to that described above with respect to base 30 of interface 18. For example, base layer 130 may include a silicone polymer preparation in which thermally conductive particles are dispersed.

Interface 118 further includes an upcoat layer 136 applied to outer surface 134 of base layer 130 at both first and second sides 126, 127 of interface 118. In preferred embodiments, upcoat layer 136 may be analogous to upcoat 36 of interface 18, as described above. Upcoat layer 136 may comprise a polymer matrix, and exhibit, in an intermediate condition, a compressive modulus of less than $10^4$ Pa. In some embodiments, upcoat layer 136 may include a silicone polymer preparation in which thermally conductive particles are dispersed to enhance thermal conductivity properties thereof. Upcoat layer 136 may exhibit a compressive modulus exceeding $10^4$ Pa in its finished condition, such as in electronic assembly 10.

Interface 118 may include first and second release liners 142, 144 for improved handling of interface 18 prior to the production of electronic device assembly 10 (such as when upcoat layer 136 is still in its intermediate condition). First and second release liners 142, 144 are well known in the art, and may be removed prior to installation of the interface 118 at electronic device assembly 10. Consequently, a thickness "T" of interface 118 does not include release liners 142, 144 as such liners 142, 144 would typically be removed prior to use of interface 118 in electronic device assembly 10. Thickness "T" of interface 118 is defined along thickness axis 138, and extends through upcoat layer 136, base layer 130, and core 128. Interface 118 exhibits a thermal conductivity of at least 0.5 W/m*K, and an electrical resistance of at least $10^{10}$ Ω*m through thickness "T". Moreover, interface 118 preferably exhibits a voltage breakdown value of at least 3 kV through thickness "T".

As described above, interface 118 not only provides an efficient pathway for transfer of thermal energy, but may also act as a joint for securing together separate components of an assembly, such as electronic device assembly 10. The interfaces of the present invention therefore further exhibit adhesion properties for establishing a strong bond to such components. The interfaces of the present invention may be prepared through a variety of known techniques. An example preparation technique includes solvent coating base layer 130 at 60-70% solids by weight to first and second sides 126, 127 of core 128 to a substrate thickness "$t_3$" of between about 100-250 μm, which includes the thickness of base layer 130 and core layer 128. Base layer 130 may then be dried of solvent and cross-linked (cured) in a forced-air oven to achieve a compressive modulus of at least $10^5$ Pa. Upcoat layer 136 may then be solvent coated at at 60-70% solids by weight outer surface 134 of base layer 130 to a total thickness "T" of between 150-600 μm. Upcoat layer 136 may be dried of solvent, but otherwise left substantially as-is (uncured) with a compressive modulus of less than $10^4$ Pa in the intermediate condition of upcoat layer 136. Due to the general tackiness of the relatively low-modulus uncured upcoat layer 136, release liners 142, 144 may be applied to upcoat layer 136 to facilitate handling of interface 118 prior to installation in an electronic device assembly. At installation, one or both of release liners 142, 144 may be removed from upcoat layer 136 to expose the relatively low modulus (<$10^4$ Pa) uncured upcoat layer 136. The interface may then be positioned for attachment to, for example, one or more of thermal dissipation member 16 and electronic component 12, with upcoat layer 136 in contact with respective heat transfer surfaces of such thermal dissipation member 16 and electronic component 12. A force may be applied to ensure securing contact as between interface 118 and the respective components of electronic device assembly 10, followed by a curing procedure to cause cross-linking in upcoat layer 136, with such cross-linking (curing) enhancing the adhesion/bonding of the components to the interface, and bringing upcoat layer 136 to a finished condition. Typical assembly pressure applied in the securing process may be between about 75-300 psi. Such pressure may be applied for a predetermined period of time prior to the curing process for upcoat layer 136, or may be applied at constant or varying levels throughout the upcoat layer 136 curing process. In one embodiment, upcoat layer 136 (and upcoat 36) cures to its finished condition upon six minutes in an oven set at 160° C. It is to be understood, however, that various curing modalities and procedures may be employed to appropriately cure the base and upcoat layers of the present interfaces.

EXAMPLE

An interface in accordance with the structure illustrated in FIG. 3 was prepared with a thickness "T" of 250 μm ("Example 1"), and compared to a conventional interface available from Arlon, LLC of Bear, Delaware under the trade name Secure® 1500 FG ("Comparison Sample"). The following table sets forth the comparison results, with the bonding data representing the application of a TO-220 transistor electronic component coupled to a solid aluminum base via the respective interface with the stated application pressure:

TABLE 1

| Material | Initial Bonding Pressure (psi) | Initial Bonding Time (s) | Failure Torque (in-lb) | Voltage Breakdown (kVAC) | Thermal Performance (° C./W) |
|---|---|---|---|---|---|
| Example 1 | 300 | 10 | 27.2 | 5.28 | 1.98 |
| Comparison Sample | 300 | 10 | 18.5 | 4.42 | 1.98 |
| Example 1 | 300 | 30 | 32.3 | 5.46 | 2.04 |
| Comparison Sample | 300 | 30 | 21.1 | 4.18 | 1.98 |
| Example 1 | 300 | 300 | 31.7 | 5.22 | 2.07 |
| Comparison Sample | 300 | 300 | 17.3 | 3.53 | 2.1 |
| Example 1 | 300 | 900 | 30.7 | 4.82 | 2.02 |
| Comparison Sample | 300 | 900 | 16.2 | 1.3 | 2.1 |

Figure 4:
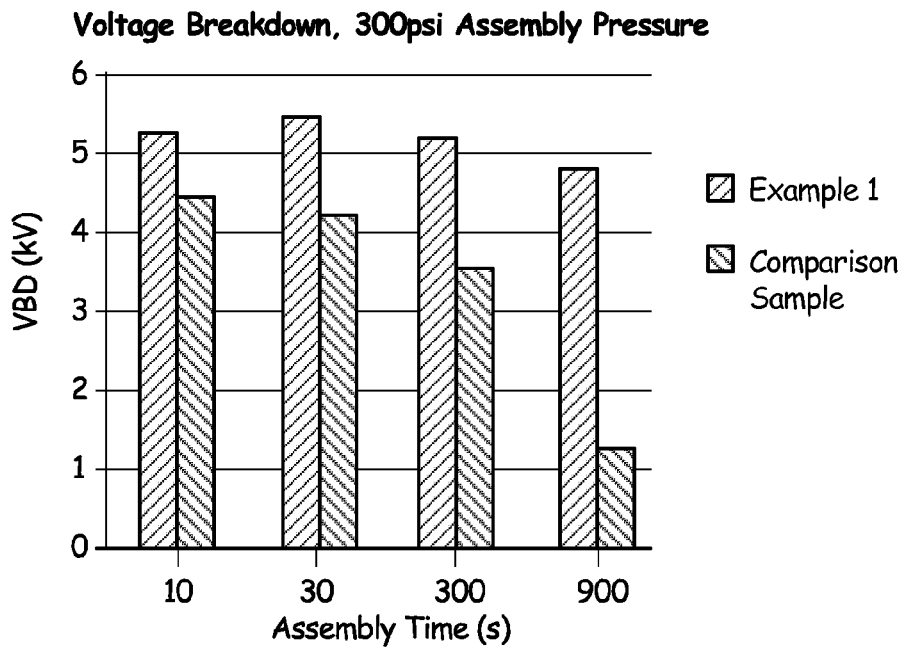
FIG. 4 is a performance comparison chart of a thermally conductive dielectric interface of the present invention.
Figure 5:
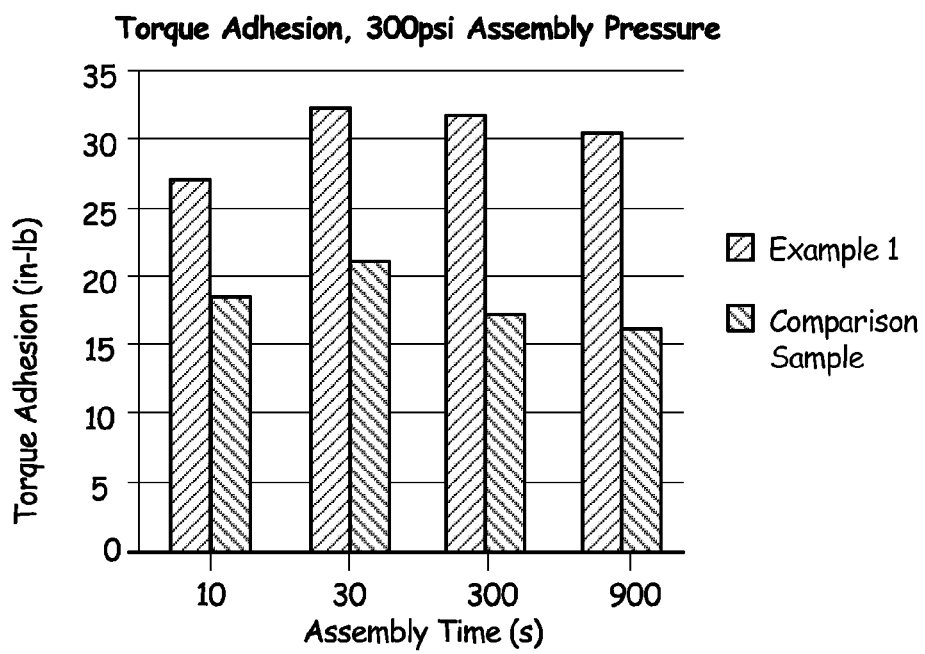
FIG. 5 is a performance comparison chart of a thermally conductive dielectric interface of the present invention.
Figure 6:
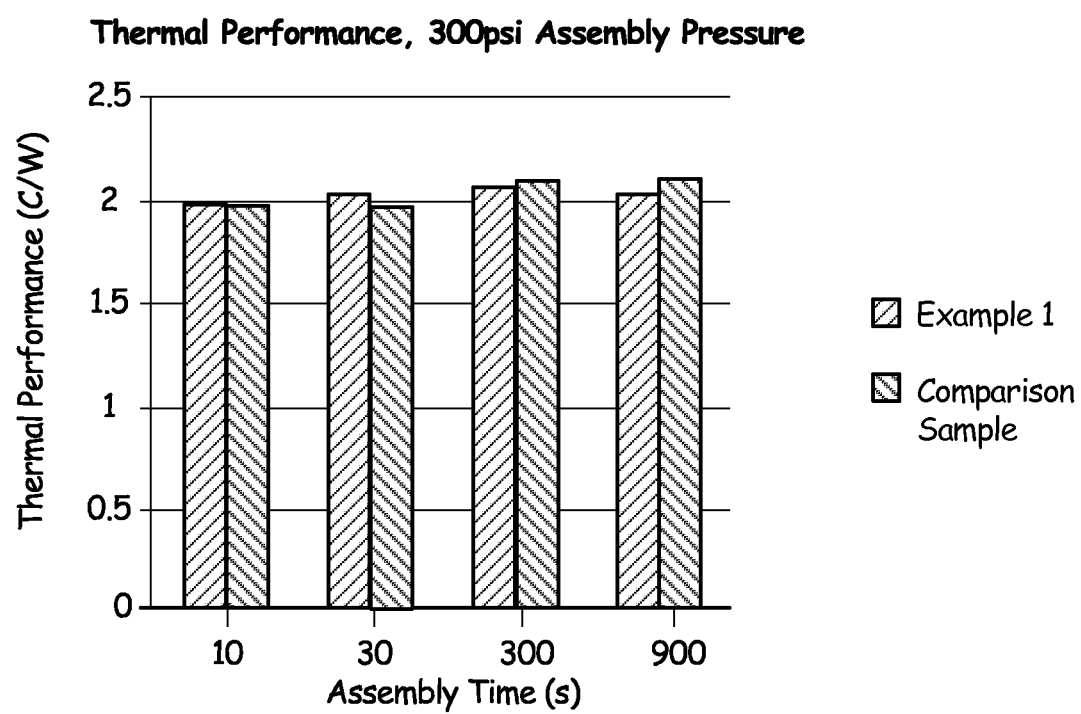
FIG. 6 is a performance comparison chart of a thermally conductive dielectric interface of the present invention.

FIGS. 4-6 represent the performance characteristics of the present interface in comparison to the Arlon Secure® 1500 FG material under a 300 psi assembly pressure for up to 900 seconds. FIGS. 4-6 clearly demonstrate an improved voltage breakdown, particularly with increasing assembly time, as well as significantly improved adhesion characteristics, without diminishing thermal performance. The performance data represented in FIGS. 4-6 was obtained through testing following the cure of the upcoat layer of the present interface to its finished condition, wherein the upcoat layer may exhibit a compressive modulus exceeding $10^4$ Pa.

The invention has been described herein in considerable detail in order to comply with the patent statutes, and to provide those skilled in the art with the information needed to apply the novel principles and to construct and use embodiments of the invention as required.

However, it is to be understood that various modifications can be accomplished without departing from the scope of the invention itself.

What is claimed is:

1. A thermally conductive dielectric interface, comprising:
    a base having first and second sides substantially parallel to a base plane, and exhibiting a compressive modulus of at least $10^5$ Pa, said base comprising a first silicone polymer preparation; and
    an upcoat disposed at said first and second sides of said base, said upcoat exhibiting a compressive modulus of less than $10^4$ Pa, and comprising a second silicone polymer preparation, wherein a thickness of said interface is defined along an axis perpendicular to said base plane and extends through said upcoat and said base, and said interface exhibiting a voltage breakdown value of at least 3 kV and a thermal conductivity of at least 0.5 W/m*K through said thickness.

2. The thermally conductive dielectric interface as in claim 1, including particulate filler dispersed in each of said first and second silicone polymer preparations.

3. The thermally conductive dielectric interface as in claim 1 wherein said first silicone polymer preparation is cured and said second silicone polymer preparation is dried of solvent in an uncured state.

4. The thermally conductive dielectric interface as in claim 1 wherein said interface exhibits an electrical resistance of at least $10^{10}$ Ω*m through said thickness.

5. The thermally conductive dielectric interface as in claim 1 wherein said base is between 0.1-0.25 mm along said axis.

6. The thermally conductive dielectric interface as in claim 5 wherein said upcoat is between 0.05-0.30 mm along said axis.

7. An electronic device assembly comprising
    a heat sink;
    a heat-generating component; and
    a thermally conductive dielectric interface comprising
        a base having first and second sides substantially parallel to a base plane, and exhibiting a compressive modulus of at least $10^5$ Pa, said base comprising a first silicone polymer preparation, and
        an upcoat disposed at said first and second sides of said base and comprising a second silicone polymer preparation, wherein a thickness of said interface is defined along an axis perpendicular to said base plane and extends through said upcoat and said base, and
        said interface exhibiting a voltage breakdown value of at least 3 kV and a thermal conductivity of at least 0.5 W/m*K through said thickness;
    wherein said thermally conductive dielectric interface is disposed between said heat sink and said heat-generating component.

8. The electronic device assembly of claim 7 wherein said upcoat bonds said interface to said heat sink and said heat-generating component.

9. The electronic device assembly of claim 8, wherein said upcoat exhibits a compressive modulus of greater than $10^4$ Pa.

10. The electronic device assembly of claim 9 wherein said second silicone polymer preparation is cross-linked.

11. A thermally conductive dielectric interface, comprising:
    a core having first and second opposed surfaces substantially parallel to a core plane, and defining respective first and second sides of said interface;
    a base layer with an inner surface applied to each of said first and second surfaces of said core, said base layer comprising thermally conductive particles dispersed in a first polymer preparation, wherein said base layer exhibits a compressive modulus of at least $10^5$ Pa; and
    an upcoat layer applied to an outer surface of said base layer at both said first and second sides of said interface, said upcoat layer comprising thermally conductive particles dispersed in a second polymer preparation, wherein said upcoat layer exhibits a compressive modulus of less than $10^4$ Pa, wherein a thickness of said thermally conductive interface is defined along an axis perpendicular to said core plane and extends through said upcoat layer, said base layer, and said core, and said interface exhibits a thermal conductivity of at least 0.5 W/m*K, and an electrical resistance of at least $10^{10}$ Ω*m through said thickness.

12. The thermally conductive dielectric interface as in claim 11, wherein said thermally conductive particles are metal or ceramic.

13. The thermally conductive interface as in claim 11 wherein said core comprises a fiberglass film.

14. The thermally conductive interface as in claim 11 wherein said first and second polymer preparations include a silicone polymer matrix.

\* \* \* \* \*